United States Patent [19]

Barjhoux et al.

[11] 4,398,148
[45] Aug. 9, 1983

[54] ELECTROMAGNETIC COIL SYSTEM FOR EXAMINATION OF LARGE OBJECTS BY NUCLEAR MAGNETIC RESONANCE AND WHOLE-BODY IMAGING MACHINE USING A SYSTEM

[75] Inventors: Yves M. Barjhoux, Orsay; Hervé Saint Jalmes, Paimpol; Jacques R. Taquin, Bures, all of France

[73] Assignee: Thomson - CSF, Paris, France

[21] Appl. No.: 230,706

[22] Filed: Feb. 2, 1981

[30] Foreign Application Priority Data

Feb. 5, 1980 [FR] France ................................ 80 02497

[51] Int. Cl.³ .......................................... G01N 27/00
[52] U.S. Cl. ..................................... 324/307; 324/309
[58] Field of Search ............... 324/300, 307, 311, 309, 324/318, 319, 320

[56] References Cited

U.S. PATENT DOCUMENTS 3,789,832  2/1974  Damadian ........................... 324/309
3,932,805  1/1976  Abe ..................................... 324/309
4,315,216  2/1982  Clow ................................... 324/307

FOREIGN PATENT DOCUMENTS 2755956  6/1978  Fed. Rep. of Germany .

*Primary Examiner*—Michael J. Tokar
*Attorney, Agent, or Firm*—Roland Plottel

[57] ABSTRACT

In a system for obtaining images on the principle of nuclear magnetic resonance (NMR) of nuclei contained in the human body, two symmetrical coils constituting an electromagnet are spaced apart so that a patient's body can be placed transversely with respect to the axis of revolution of the electromagnet. A set of NMR coils for producing a high-frequency magnetic field at right angles to the field of the electromagnet comprises at least one solenoid coil placed around the part of the body to be examined. This novel configuration achieves enhanced sensitivity and reduces exposure times by a factor greater than 2 with respect to conventional saddle-type NMR coil systems.

6 Claims, 1 Drawing Figure

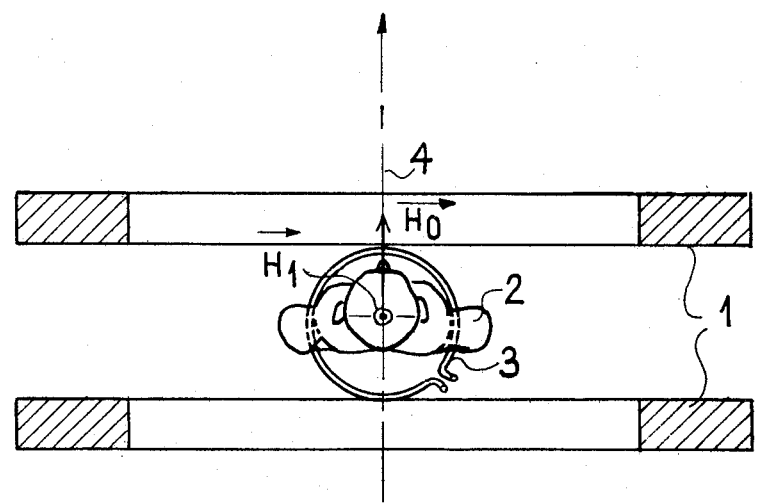

ELECTROMAGNETIC COIL SYSTEM FOR EXAMINATION OF LARGE OBJECTS BY NUCLEAR MAGNETIC RESONANCE AND WHOLE-BODY IMAGING MACHINE USING A SYSTEM

This invention relates to a novel configuration of a system of electromagnetic coils which makes it possible to obtain images of the interior of the human body under better conditions than those achieved heretofore. Imagery produced by nuclear magnetic resonance (NMR) entails the need for exposure times which are often of very long duration (up to one hour). The novel configuration proposed for the system of electromagnetic coils consisting of the electromagnet and of the NMR coil is intended to permit a reduction of these exposure times by a factor which is greater than 2. By means of this configuration, the medical use of this non-traumatic method of diagnosis is more convenient.

The method of NMR imagery is based on the principle of nuclear magnetic resonance of nuclei contained in the human body. This method is now well-known per se. For example, it is described by W. Hinshaw et al. in the "British Journal of Radiology," No 52, 36 (1979). In the majority of instances, the species observed is the hydrogen nucleus which is present in abundant concentration in all tissues. The quantity observed by NMR is the magnetization of these nuclei, this latter being proportional to the magnetic field $\vec{H_0}$ in which the patient is placed. Many methods of construction of images have been described in the scientific literature. By way of example, reference may be made to the Article by P. Brunner and R. R. Ernst in the "Journal of Magnetic Resonance" No 33, 83 (1979). The application of these methods to imagery of the whole body (at the level of the thorax or of the abdomen) calls for very long exposure times which can sometimes last up to several hours. The reason for this lies essentially in the very low value of nuclear magnetization: the signal-to-noise ratio $\psi$ of each image element attains an acceptable value only at the end of fairly long accumulation periods or "exposure times." It is clear that NMR imagery can really by employed in a systematic manner as a method of medical diagnosis only if these exposure times can be reduced to an appreciable extent and this is precisely one of the aims of the present invention. In accordance with the invention, a construction and arrangement of the system of coils which are different from those of the prior art will make it possible to increase the sensitivity and therefore to reduce the "exposure times".

It has been endeavored in the prior art to increase the sensitivity by increasing the measured quantity or in other words by increasing the magnetic field $\vec{H_0}$ applied to the patient by the electromagnet in which he is placed longitudinally. It is in fact shown that the signal-to-noise ratio is approximately proportional to $\vec{H_0}$. It is therefore advisable to make use of a field $\vec{H_0}$ whose intensity is as high as possible. In point of fact, it proves necessary to set a limit of a few tenths of Teslas for reasons of NMR detection: the resonance frequency is proportional to $H_0$; and when $H_0$ attains 0.5 Tesla, the field intensity becomes too high for the electromagnetic waves to be capable of passing through the human body without appreciable attenuation; distortions then appear on the NMR images and are difficult to correct.

In accordance with standard practice in devices of known types, the field $\vec{H_0}$ is produced by an electromagnet which is either resistive (in the case of values of $H_0$ up to 0.2 Tesla) or superconducting (in the case of higher values); the patient to be examined is placed longitudinally in the field $\vec{H_0}$ thus produced.

The present invention permits a considerable improvement in sensitivity of equipment units to which it is applied without thereby entailing the need to utilize fields $H_0$ having a value such as to result in the defects noted in the foregoing. The invention accordingly proposes a novel configuration, form and arrangement of the two sets of coils in which one set produces the magnetic field $H_0$ and the other set produces the field HF $\vec{H_1}$. The combination of these two sets of coils makes it possible to increase the sensitivity, especially by optimizing the NMR detection.

In accordance with the invention, a system of electromagnetic coils for examining bodies of large size such as the human body by means of nuclear magnetic resonance (NMR) comprises a first set of coils designated as an electromagnet for producing a uniform magnetic field $\vec{H_0}$ in which the body to be observed is placed, and a second set of coils designated as NMR coils for producing a high-frequency (HF) magnetic field ($\vec{H_1}$) at right angles to the field $\vec{H_0}$ of the electromagnet. Said system of coils is distinguished by the fact that:

the first set of coils comprises at least two symmetrical coils spaced at a sufficient distance from each other to permit introduction of the body to be observed between said two coils in the transverse position at right angles to the field $H_0$ of the electromagnet;

the second set of coils comprises at least one solenoid coil placed around the portion of the body to be examined.

These and other features of the invention will be more apparent upon consideration of the following description.

Reference will be made to the single accompanying FIGURE which is a part-sectional view showing in very diagrammatic form one example of construction of the system of electromagnetic coils in accordance with the invention.

The electromagnet 1 is shown diagrammatically in the form of an electromagnet of the resistive type comprising two coils of revolution about the axis 4. Said electromagnet produces the field $\vec{H_0}$ as represented schematically by the arrow along the axis 4. As a general rule, an electromagnet of this type consists of more than two coils in order to obtain a uniform field $H_0$ within the volume under inspection and, for example, of two pairs of coaxial coils.

In accordance with the invention, the two coils which are nearest each other (the only coils shown in the FIGURE) are sufficiently spaced apart to allow the patient 2 to be examined to be placed between said two coils in a recumbent position located transversely with respect to the axis of revolution 4 of the electromagnet within the space formed between said two coils 1.

One particularly advantageous example of application of this arrangement of the electromagnet is described in a French patent Application filed on the same date as the present patent Application by the two Applicant companies. This arrangement permits a construction of the coils of the second set designated as NMR coils 3, thus resulting in optimized NMR detection.

In fact, in the prior art systems in which the patient to be examined was placed in a longitudinal recumbent position within the electromagnet, the NMR coils had to be constituted by two sets of turns each having a so-called "saddle" configuration and placed on each side of the patient's trunk in order to produce a high-frequency field $\vec{H_1}$ at right angles to the field $\vec{H_0}$ and in order to obtain a cross-sectional image of the torso or of the abdomen. This arrangement suffered from a number of disadvantages which had the effect of impairing the final sensitivity of the system.

On the contrary, in the system in accordance with the invention, the second set of coils or coil unit (that is, the NMR coil or coils employed for producing the high-frequency field $\vec{H_1}$) is composed of one or a number of solenoid turns placed immediately around the patient's trunk; the field $\vec{H_1}$ thus produced is accurately located at right angles to the field $\vec{H_0}$.

It is worthy of note that an NMR coil 3 having a single turn makes it possible to minimize the noise of dielectric origin generated by the patient.

Moreover, said second set (of NMR) coils can comprise separate coils for HF emission and reception in a configuration which is very similar to that shown in the figure. In this case, it may prove expedient to employ a HF emission coil having a plurality of turns and a receiving coil having a single turn with a view on the one hand to optimizing the uniformity of the emitted HF field and on the other hand to reducing the dielectric noise.

Finally, a further possibility consists in arranging a number of second sets of NMR coils 3 coaxially around the patient to be examined so as to permit examination of several parts of the patient's body which are all located within the magnetic field $\vec{H_0}$ of the electromagnet.

The use of NMR solenoid coils 3 placed around a patient in the transverse position within the electromagnet offers a number of advantages resulting in the improvement of the apparatus which is equipped with said coils.

The uniformity of the field $\vec{H_1}$ produced by the NMR coil in the inspection zone or image zone is better than the uniformity produced by prior art coils of the "saddle" type. The essential reason for this lies in the fact that the zone to be imaged and usually consisting of a thin "slice" of the human trunk can be inscribed within the volume delimited by a turn, which is not the case with a coil of the "saddle" type.

It is consequently much easier to apply the different NMR techniques by sequences of high-frequency pulses. In particular, it is possible to adopt methods for restoring nuclear magnetization after it has been measured, these techniques being described for example by D. Jones and H. Sternlicht in the "Journal of Magnetic Resonance," No 6: 167–196 (1972). This accordingly has the effect of eliminating part of the waiting periods prior to restoring the magnetization by relaxation. The total exposure time may thus be reduced by a factor which is distinctly higher than 2.

Moreover, the uniformity of the field $\vec{H_1}$ prevents any two-dimensional distortions of the image obtained and thus avoids the need for any complex numerical corrections which had proved necessary in the prior art. Distortion arising from residual non-uniformity is easier to correct insofar as it is exclusively radial. It should be noted in addition that, if a larger coil diameter is adopted, non-uniformity of the field $\vec{H_1}$ may be reduced to the necessary extent.

The intensity of the field $\vec{H_1}$ is higher than in the case of "saddle" coils, all other things being equal; it is in fact of optimum value in the case of a solenoid coil. The emission of a given field $H_1$ therefore requires a minimum value of HF power. Moreover, reception of the information-carrying NMR signal is more efficient: the amplitude of the detected signal is greater and the various sources of noise are correspondingly less troublesome.

It is therefore easier to reduce the influence of noises which are external with respect to the patient, namely thermal noise of the coil and of the HF preamplifier. Moreover, the inductive noise generated by the patient is lower than in the case of a saddle-type coil; the reason for this lies in the fact that the field $\vec{H_1}$ is spatially less extensive.

The present invention finds its main application in the field of medical diagnosis in which the reduction of exposure times in the case of a whole body is of considerable interest. Further applications are possible in the biological field such as, for example, non-destructive testing of organic specimens in the pharmaceutical or agricultural industry or, in the general industrial field, testing in situ of conditions of flow of water within a pipe without any disturbance.

What is claimed is:

1. A system of electromagnetic coils for examining bodies of large size such as the human body by means of nuclear magnetic resonance (NMR), comprising a first set of coils designated as an electromagnet for producing a uniform magnetic field $\vec{H_0}$ in which the body to be observed is placed, and a second set of coils designated as NMR coils for producing a high-frequency (HF) magnetic field ($\vec{H_1}$) at right angles to the field $H_0$ of the electromagnet, wherein:

the first set of coils comprises at least two symmetrical coils spaced at a sufficient distance from each other to permit introduction of the body to be observed between said two coils in the transverse position at right angles to the field $H_0$ of the electromagnet;

the second set of coils comprises at least one solenoid coil placed around the portion of the body to be examined.

2. A system of coils according to claim 1, wherein the second set of coils comprises a single NMR solenoid coil for HF emission and reception.

3. A system of coils according to claim 2, wherein said single coil of the second set comprises a single circular turn.

4. A system of coils according to claim 1, wherein the second set of coils comprises two coaxial NMR solenoid coils around the portion of the body to be examined, a first coil of said second set being adapted to operate in emission of the HF field ($H_1$) and the second coil of said set being adapted to operate in reception of the information-carrying HF field.

5. A system of coils according to claim 4, wherein the first NMR coil has a plurality of turns and the second coil has a single turn with a view on the one hand to optimizing uniformity of the emitted HF field and on the other hand to reducing the dielectric noise.

6. A system of coils according to claim 1, wherein said system comprises a plurality of second sets of coils arranged coaxially around the body to be examined so as to permit examination of several parts of said body which are all located within the magnetic field ($H_0$) of the first set of coils.

* * * * *